(12) United States Patent
Hegde

(10) Patent No.: US 8,633,751 B2
(45) Date of Patent: Jan. 21, 2014

(54) CENTRALIZED POWER GATING CONTROL FOR PARTITIONED POWER GATES

(75) Inventor: Arun B. Hegde, Bangalore (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 62 days.

(21) Appl. No.: 13/293,613

(22) Filed: Nov. 10, 2011

(65) Prior Publication Data

US 2013/0120045 A1    May 16, 2013

(51) Int. Cl.
*H03K 3/02*    (2006.01)

(52) U.S. Cl.
USPC ........... 327/198; 327/530; 323/908; 713/330; 716/133

(58) Field of Classification Search
USPC ......... 327/198, 530, 534, 538, 540, 541, 543, 327/544; 323/908, 299, 202; 716/133; 713/300, 310, 320, 323, 324, 330, 340
See application file for complete search history.

(56) References Cited

U.S. PATENT DOCUMENTS

| 6,002,292 | A  | * | 12/1999 | Allen et al. ................... 327/379 |
| 7,276,932 | B2 | * | 10/2007 | Kuang et al. ................... 326/33 |
| 7,589,584 | B1 | * | 9/2009  | Bui .............................. 327/538 |
| 7,863,778 | B2 | * | 1/2011  | Flynn et al. ................... 307/140 |

* cited by examiner

*Primary Examiner* — Lincoln Donovan
*Assistant Examiner* — Thomas Skibinski
(74) *Attorney, Agent, or Firm* — Volpe and Koenig, P.C.

(57) ABSTRACT

Power gating control and related circuitry for integrated circuits is described herein. A centralized power gating control circuit uses trigger circuits to control the on/off switching of power gating circuits distributed at different points in a chip, integrated circuit, module or block (collectively "IC"). The power gating circuits may include power gates partitioned for sleep and shutdown modes. The shutdown mode power gates may employ multi-level power gate architecture to minimize inrush current during power-up of the IC. Each level may be associated with or tied to a trigger circuit and activated based on a voltage level reaching the voltage threshold of the trigger circuit. The power gating control and related circuitry may be embedded in the IC.

20 Claims, 8 Drawing Sheets

US 8,633,751 B2

CENTRALIZED POWER GATING CONTROL FOR PARTITIONED POWER GATES

FIELD OF INVENTION

The present invention is generally directed to integrated circuits and in particular, to integrated circuits employing power gating functionality.

BACKGROUND

Integrated circuits use power gating circuitry to temporarily turn-off circuit blocks or modules in order to reduce the overall leakage power. This may be referred to as being in shutdown or sleep mode. The power gating circuitry needs to be turned on in a controlled fashion to minimize the impact of inrush currents into the integrated circuits, where inrush currents occur when coming out of shutdown or sleep modes.

SUMMARY OF EMBODIMENTS OF THE INVENTION

Power gating control and related circuitry for integrated circuits is described herein. A centralized power gating control circuit uses trigger circuits to control the on/off switching of power gating circuits distributed at different points in a chip, integrated circuit, module or block, (collectively "IC"). The power gating circuits may include power gates partitioned for sleep and shutdown modes. The shutdown mode power gates may employ multi-level power gate architecture to minimize inrush current during power-up of the IC. Each level may be associated with, or tied, to a trigger circuit and activated based on a voltage level reaching the voltage threshold of the trigger circuit. The power gating control and related circuitry may be embedded in the IC.

BRIEF DESCRIPTION OF THE DRAWINGS

A more detailed understanding may be had from the following description, given by way of example in conjunction with the accompanying drawings, wherein.

DETAILED DESCRIPTION OF THE EMBODIMENTS

Figure 1:
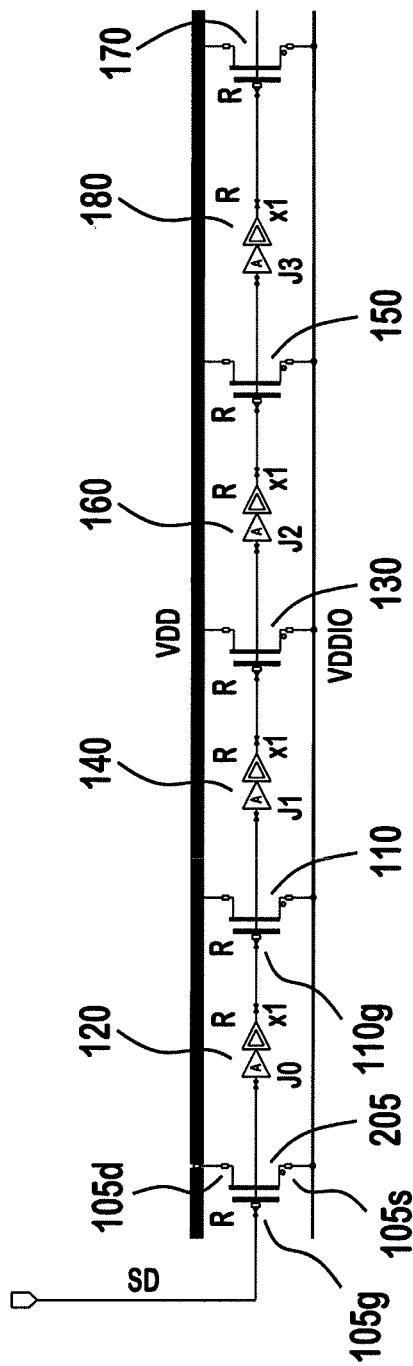
FIG. 1 is a block diagram of a daisy chain configuration of delay buffers to control inrush currents.

A block diagram 100 of a daisy chain configuration of delay buffers to control inrush currents is shown in FIG. 1. The block diagram 100 shows a power gate 105 having a gate 105g connected to a shutdown signal (SD), where a value of zero indicates that power gate 105 is on (coming out of shutdown mode) and a value of 1 indicates that power gate 105 is off (going into shutdown mode). The power gate 105 has a source 105s tied to VDDIO and a drain 105d tied to VDD. A subsequent power gate 110 is similarly tied to VDDIO and VDD. However, the gate 110g is connected to a delay buffer 120 to ensure that power gate 110 turns on at a specific or predefined time period, (as represented by the delay buffer 120), after power gate 105 turns on. As illustrated, power gate 130 turn on is delayed by delay buffers 120 and 140, power gate 150 turn on is delayed by delay buffers 120, 140, and 160, power gate 170 is delayed by delay buffers 120, 140, 160 and 180 and so on. The delay buffers are daisy chained together so that each power gate has a different turn on time. This limits the inrush current.

Figure 2:
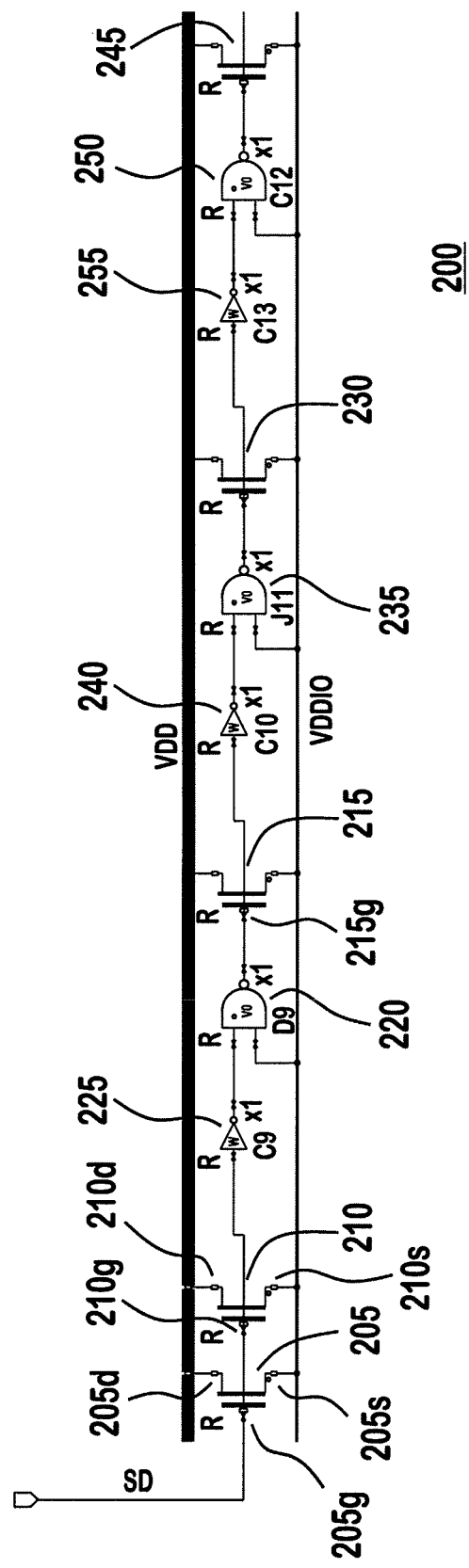
FIG. 2 is a block diagram of a daisy chain configuration of NAND2 gates to control inrush currents.

A block diagram 200 of a daisy chain configuration of two-input NAND (NAND2) gates to control inrush currents is shown in FIG. 2. The block diagram 200 shows a power gate 205 and 210 having gates 205g and 210g connected to a shutdown signal (SD), where a value of zero indicates that power gate 205 is on (coming out of shutdown mode) and a value of 1 indicates that power gate 205 is off (going into shutdown mode). The power gates 205 and 210 each have a source 205s and 210s tied to VDDIO and a drain 205d and 210d tied to VDD. Power gates 205 and 210 ensure that when SD=0, the VDDIO grid starts charging up towards VDD. Each of the subsequent power gates, (i.e., power gates 215, 230 and 245), are controlled by a daisy chain of NAND2 circuits. For example, gate 215g of power gate 215 is tied to an output of a NAND2 gate 220. One input of the NAND2 gate 220 is tied to the SD signal via an inverter 225 and the other input is tied to VDDIO. Power gate 215 turns on after VDDIO, (as determined at a tap point), at the input of the NAND2 gate 215 reaches or crosses a predefined threshold. As illustrated, power gates 230 and 240 are similarly controlled by NAND2 gates 235 and 250 respectively, where the output of the NAND2 gate 220 is tied to an inverter 240 and the output of NAND2 gate 235 is tied to an inverter 255. Inverters 240 and 244 are in turn each tied to a corresponding input of NAND2 gate 235 and 250, respectively. The NAND2 gates are thus effectively daisy chained together to control and limit the inrush current.

The above implementations require additional area overhead in the power gate circuitry to account for the delay buffers and NAND2 gate circuitry. Moreover, fine grained control of the inrush currents, (due to simultaneous switching 'ON' of power-gate banks), is not possible since the NAND2 in the daisy chain could start switching all at once when the internal grid voltage reaches a certain minimum threshold, (this is typically around 60% of VDD even for skewed NAND2s). In other words, power gates may turn on too early as there is no ability to tune the thresholds of the NAND2 gate circuitry.

In some instances, counters may be used to selectively turn 'ON' the power gate blocks in sequence by counting the clock ticks coming into the macro, where the macro may refer to the embedded memory module or the integrated circuit that is using power gating. This solution has a large area overhead associated with it since the required counters will necessarily need to count a large number of clock ticks to allow the internal power grid, i.e., VDDIO, to ramp up from shutdown or 'OFF' states. Typically this solution cannot be implemented in an area efficient manner within embedded static random access memory (SRAMs) and hence are rarely used. For example, the counter will use a significant portion of the control section area.

Described herein is power gating control and related circuitry for integrated circuits that uses a centralized power gating control circuit with trigger circuits to control the on/off switching of power gating circuits distributed at different points in or on a chip, integrated circuit, module or block (collectively "IC"). Although logic area overhead is minimized in comparison to implementations that use daisy chained power-gate control buffers or counters, the turn-on of power gates is sequenced to support fine-grained control of inrush currents. That is, the power gating control and related circuitry described herein provides the ability to control the turn-on of power gates based on precise voltage levels, (as accurate as the triggers, such as Schmitt triggers, being used to sense voltage levels as discussed and shown below). For purposes of illustration, the power gating control and related circuitry may be implemented, for example, within an embedded random access memory (RAM).

In general, a centralized power gating control circuit may use trigger circuits to control the on/off switching of power gating circuits distributed at different points in an IC. The power gating circuits may include power gates partitioned for sleep and shutdown modes. The shutdown mode power gates may employ a multi-level power gate architecture to minimize inrush current during power-up of the IC. As shown in detail with respect to FIGS. 4A and 4B, each level of the multi-level power gate architecture may be associated with, or is tied, to a trigger circuit and activated based on a voltage level reaching the voltage threshold of the trigger circuit. The power gating control and related circuitry may be embedded in the IC.

Figure 3:
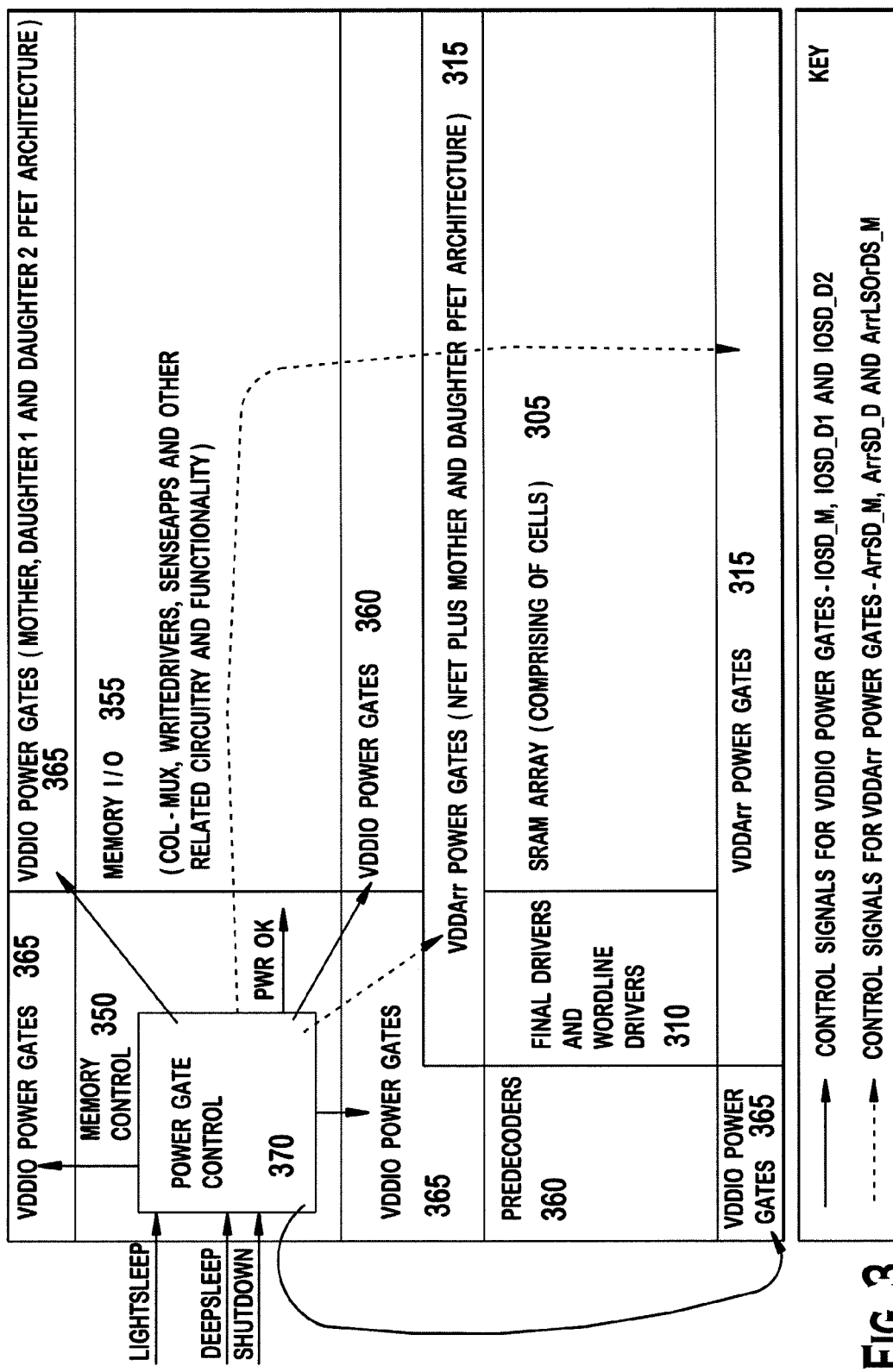
FIG. 3 is an example high level block diagram of a memory employing centralized power gating circuitry with distributed power gates.

A high level block diagram 300 of a memory employing centralized power gating circuitry with distributed power gates is shown in FIG. 3. The block diagram 300 includes an SRAM 305 consisting of memory cells, and final drivers and wordline drivers 310 that are coupled and/or connected to array power grid (VDDArr) power gates 315. The block diagram 300 also includes a memory control 350, a memory input/output (I/O) 355 and predecoders 360 that are coupled and/or connected to I/O power (VDD) grid (VDDIO) power gates 365.

Memory control 350 further includes a power gate control 370 that has three input signals, LightSleep (LS), DeepSleep (DS) and Shutdown (SD), and that outputs control signals to VDDArr power gates 315 and VDDIO power gates 365. The three signals may come from a central control module within a central processing unit (CPU) or a graphics processing unit (GPU), which may decide what state the embedded memories should be in for power saving purposes or other like reasons. As shown in FIG. 3, the power gate architecture implemented for the SRAM array 305 and the memory I/O 355 are controlled by separate control signals. The LS input signal biases the VDDArr down by a diode drop, gates all internal clocks and keeps the VDDIO turned on. The DS input signal biases the VDDArr down by a diode drop and shuts off the VDDIO. The SD input signal shutdowns both the VDDArr and VDDIO. A value of zero ("0") for any of the input signals indicates that the IC is coming out of LS, DS or SD mode and that the appropriate power gates need to be turned on.

The power gate control 370 also outputs a PowerOk signal to memory control 350 when the power grid arrays associated with the SRAM array 305 and the memory I/O 355 have reached at least 90% of VDD. The PowerOK signal notifies memory control 350 that all the power gates have been turned on and it is okay to run and use the memories in a regular, nominal manner. A combination of the LS, DS, SD input signals and the PowerOK signal may be used to control the internal clock enables. Absent the PowerOk signal notification, if the clocks and other sections of the memory are allowed to begin operation before all the power gates are turned on, the power grid will droop because the power demands of the switching logic may exceed what the currently 'On' power gates can support. As a result of the voltage droop, the switching logic may not behave correctly. When all power gates are on, the PowerOK signal goes high.

The power gate architecture implemented for the SRAM array 305 is partitioned to address going into and coming out of lightsleep and deepsleep modes differently from shutdown mode. In lightsleep and deepsleep mode, the VDDArr power gates 315 include NFET power gates that may be used to power the SRAM array 305 when array access may not be allowed but data retention may be desired. The size of the NFET power gates may be chosen to counteract leakage through the SRAM cells. In shutdown mode, the VDDArr power gates 315 and VDDIO power gates 365 may include multi-level PFET power gates, identified as mother and daughter PFET power gates, that provide a scaled powering up of the VDDArr and VDDIO power grids and is discussed in detail below with respect to FIGS. 4A and 4B.

Figure 4A:
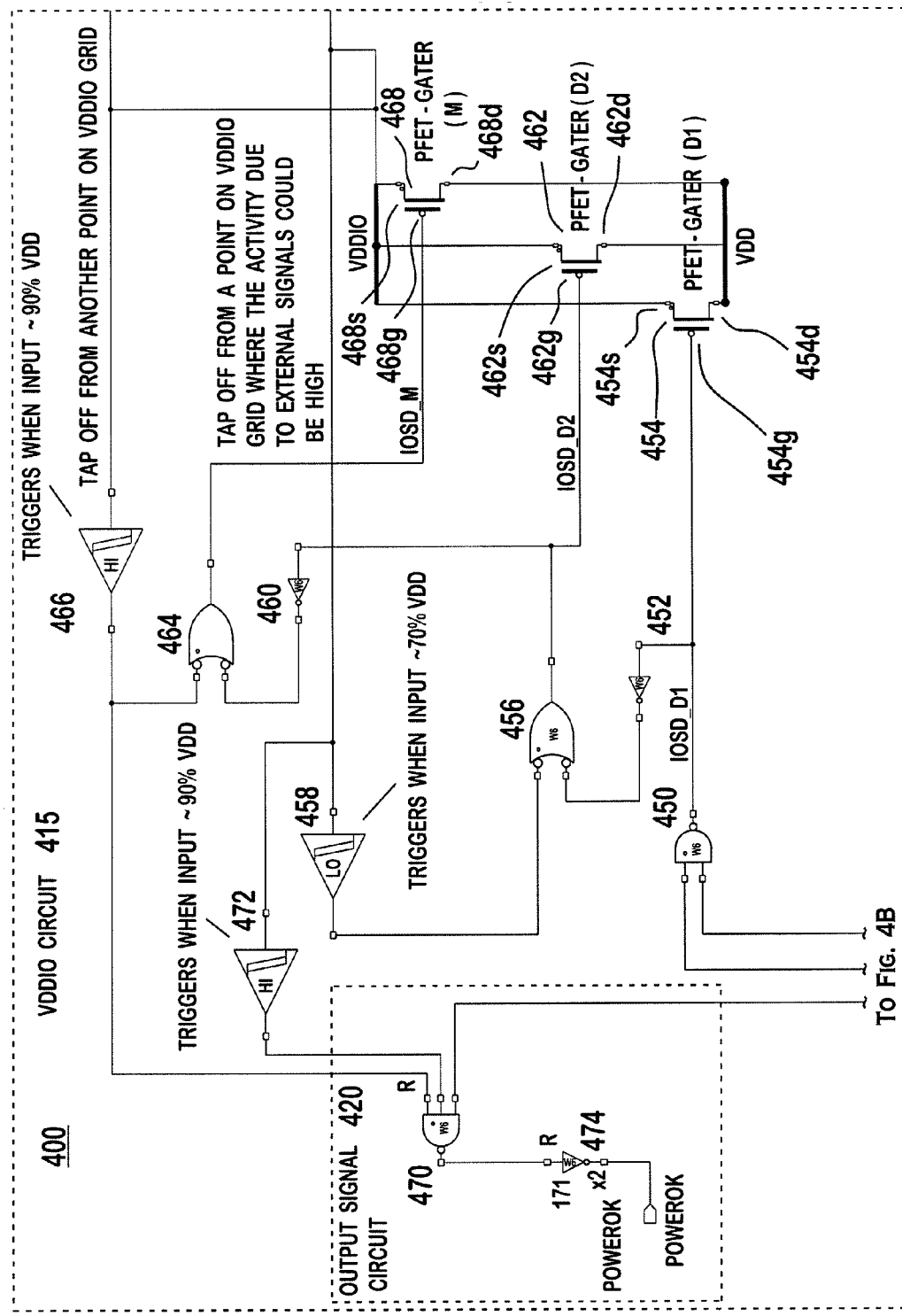
FIGS. 4A and 4B are an example block diagram of a centralized power gating circuit with multi-level power gate architecture.
Figure 4B:
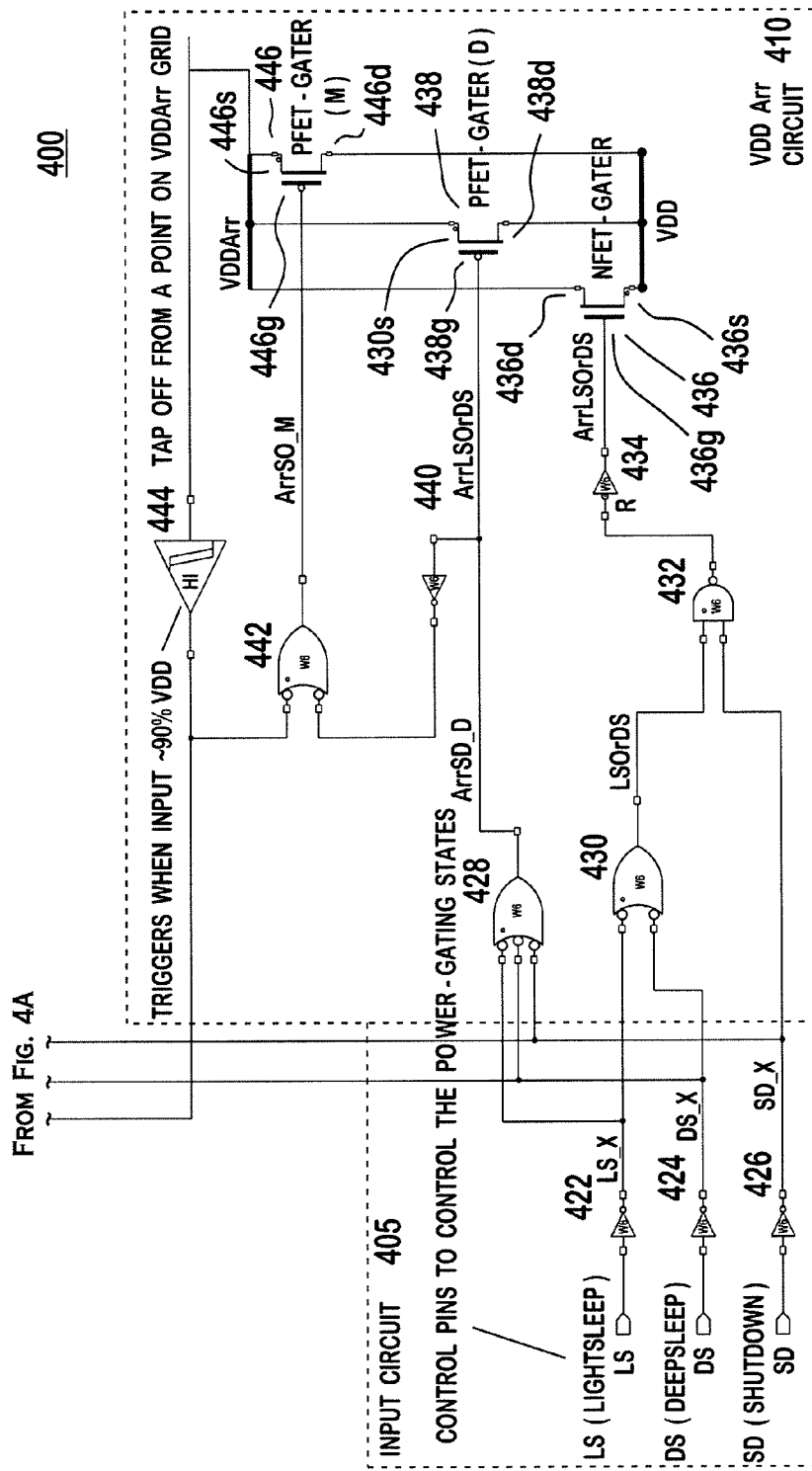

A block diagram 400 of a centralized power gating circuit with multi-level power gate architecture is shown in FIGS. 4A and 4B. The block diagram 400 includes an input circuit 405, a VDDArr circuit 410, a VDDIO circuit 415, and an output signal circuit 420. Input circuit 405 includes three inverters 422, 424 and 426 tied to the LS input signal, the DS input signal and the SD input signal, respectively. The input circuit 405 feeds the three input signals to the VDDArr circuit 410, and the VDDIO circuit 415 via the three inverters 422, 424, and 426.

The VDDArr circuit 410 includes a three input NAND gate 428, where the first input is tied to an output of the LS inverter 422, the second input is tied to the DS inverter 424 and the third input is tied to the SD inverter 426. It also includes a two input NAND gate 430 that has an input tied to the LS inverter 422 and another input tied to the DS inverter 424. The output of the NAND gate 430 is tied to one input of a NAND gate 432, and the other input of the NAND gate 432 is tied to an output of the SD inverter 426. The output of the NAND gate 432 is tied to an inverter 434, which in turn is tied to a gate 436g of n-type field-effect transistor (NFET) power gate 436. The drain 436d of NFET power gate 436 is tied to VDDArr and the source 436s is tied to VDD.

The output of the NAND gate 428 is tied to a gate 438g of a p-type FET (PFET) daughter power gate 438 and is also tied to an inverter 440. The drain 438d of PFET power gate 438 is tied to VDD and the source 438s is tied to VDDArr. One input of a NAND gate 442 is tied to an output of inverter 440 and another input is tied to an output of a settable voltage trigger 444. The settable voltage trigger 444 has as an input a voltage tapped from a point on a VDDArr grid and may be triggered when the input reaches or crosses a threshold. In this instance, the threshold may be set to approximately 90% of VDD. The output of NAND gate 442 is tied to a gate 446g of a p-type FET (PFET) mother power gate 446. The drain 446d of NFET power gate 446 is tied to VDD and the source 438s is tied to VDDArr.

The VDDIO circuit 415 includes a NAND gate 450 which has one input tied to a DS inverter 424 and another input tied to a SD inverter 426. The output of the NAND gate 450 is tied to an input of an inverter 452 is tied to a gate 454g of a p-type FET (PFET) daughter one power gate 454. The source 454s of power gate 454 is tied to VDDIO and the drain 454d is tied to VDD.

A NAND gate 456 has one input tied to an output of the inverter 440 and another input tied to an output of a settable voltage trigger 458. The settable voltage trigger 458 has as an input a voltage tapped from a point on a VDDIO grid where the activity due to external signals may be high. The trigger 458 may be triggered when an input reaches or crosses a threshold. In this instance, the threshold may be set to approximately 70% of VDD. The output of the NAND gate 456 is tied an inverter 460 and is also tied to a gate 462g of a p-type FET (PFET) daughter two power gate 462. The source 462s of power gate 462 is tied to VDDIO and the drain 462d is tied to VDD.

NAND gate 464 has one input tied to an output of the inverter 460 and has another input tied to an output of a settable voltage trigger 466. The settable voltage trigger 466 has as an input a voltage tapped from a point on a VDDIO grid and may be triggered when an input reaches or crosses a threshold. In this instance, the threshold may be set to approximately 90% of VDD. The output of the NAND gate 464 is to a gate 468g of a p-type FET (PFET) mother power gate 468. The source 468s of power gate 468 is tied to VDDIO and the drain 468d is tied to VDD.

An output circuit 420 includes a three input NAND gate 470. A first input is tied to an output of trigger 466, a second input is tied to an output of settable voltage trigger 472 and a third input is tied to an output of trigger 444. Voltage trigger 472 has as an input a voltage tapped from a point on a VDDIO grid where the activity due to external signals may be high. The trigger 472 may be triggered when an input reaches or crosses a threshold. In this instance, the threshold may be set to approximately 90% of VDD. When the thresholds for all three triggers have been reached or crossed, the NAND gate outputs a zero or "0" to an inverter 474, which in turn signals the rest of the integrated circuit ("PowerOK") that the memory is fully powered and functional.

The truth table shown in Table 1 is essentially implemented by the logic shown in the schematic of FIGS. 4A and 4B. However, the truth table may be implemented using other circuit configurations. In one embodiment, a programmable logic array may be used. The ArrNFET and ArrPFET power gate transistors 436, 438 and 446 control the power supply to the array section of the SRAM and the IOPFET power gate transistors 454, 462 and 468 controls the power supply to the peripheral logic of the SRAM. A priority decoder may be used, where the order of priority may be such that SD has the highest priority, DS next and LS has the least priority with respect to controlling the power gates.

TABLE 1

| LS | DS | SD | ArrNFET Gaters | ArrPFET Gaters | IOPFET Gaters |
|----|----|----|----------------|----------------|----------------|
| 0  | 0  | 0  | Off            | On             | On             |
| 0  | 0  | 1  | Off            | Off            | Off            |
| 0  | 1  | 0  | On             | Off            | Off            |
| 0  | 1  | 1  | Off            | Off            | Off            |
| 1  | 0  | 0  | On             | Off            | On             |
| 1  | 0  | 1  | Off            | Off            | Off            |
| 1  | 1  | 0  | On             | Off            | Off            |
| 1  | 1  | 1  | Off            | Off            | Off            |

Appropriate sequencing of the 'turn on' of the PFET daughter power gate 438 and PFET mother power gate 446 is implemented to prevent inrush currents when waking the memory, i.e, the SRAM, from shutdown or deepsleep states. The PFET daughter power gate 438 may be sized just enough to counteract the leakage of the devices and help get the VDDArr power grid close to the VDD supply voltage when there is no activity on the memories. The PFET mother power gate 446 may be sized to supply the operating current to the VDDArr power grid when array accesses are done.

During power up, the PFET daughter power gate 438 may be turned on first to prevent excessive inrush currents. Once the VDDArr power grid reaches approximately 90% of VDD, the trigger control circuit, (i.e., trigger 444 senses this and turns on the PFET mother power gate 446. Since most of the capacitance on the VDDArr power grid has been charged up by the PFET daughter power gate 438, there are no excessive current demands on the PFET mother power gate 446, when it is turned on. This prevents excessive 'instantaneous' current demands by the memories as they wake up from sleep states. A slow ramp up of the voltage grids is implemented by turning on only the daughter gates first, (which have higher channel resistance), and then the mother gates, (that have lower channel resistance).

The power gate architecture for the memory I/O 355 is similarly implemented but has additional daughter circuitry. In particular, the power gate architecture is partitioned into mother (PFET mother power gate 468), daughter one (PFET daughter one power gate 454) and daughter two (PFET daughter two power gate 462) power gates. During power up, the PFET daughter one power gate 454 is turned on. After the VDDIO power grid reaches approximately 70% of VDD, the trigger control circuit (i.e., trigger 453), senses this and turns on PFET daughter two power gate 462. After VDDIO power grid reaches approximately 90% of VDD and is sensed by trigger 466, the PFET mother power gate 468 is turned on. The VDDIO portion is off when the memory is in shutdown or in deepsleep modes. When transitioning from these modes, the VDDIO power gates, (i.e., power gate transistors 454, 462 and 468), are activated.

The reason for having two daughter power gates in the VDDIO section and just one daughter in the VDDArr section is that there is a possibility that inputs into the Embedded SRAM, (i.e., the memory), may be toggled by the users before they are supposed to as they are waking up from the sleep modes, (i.e., data inputs, clock inputs and the like may be toggled before the VDDIO power grid is completely up). In this case, noticeable current may be drawn from the VDDIO grid by the switching activity of the logic in the I/O section. Since, the daughter one power gate sizes are chosen to simply counteract the leakage of the devices, (i.e., the devices in the SRAM periphery which may include the memory input/output and memory control devices such as the predecoder circuitry, write-data flops and write drivers, redundancy multiplexers or the like), in the I/O section, (so as to lessen the inrush currents), but not necessarily sized to supply currents to switching devices, there may exist a situation where the VDDIO power grid does not ramp up to even approximately 75% of VDD as the inputs may be toggling. This may make the memory control and memory I/O sections behave oddly.

Therefore, the power gate circuitry is implemented to sense if the VDDIO power grid has reached approximately 70% of VDD using a low threshold trigger and turn on the daughter two power gates to supply the additional current required by the switching devices. The switching devices may include devices in the SRAM periphery which may include the memory input/output and memory control devices such as the predecoder circuitry, write-data flops and write drivers, redundancy multiplexers and the like. The combined width of the daughter one and two power gates are such that even with peripheral activity, the voltage on the VDDIO power grid may reach up to approximately 90% of VDD. Once the VDDIO power grid reaches approximately 90% of VDD and it is sensed by the trigger control circuit (i.e., trigger 466), it turns on the mother power gate of the VDDIO section. Now the VDDIO power grid can be fully powered up for regular functioning modes. Since the VDDArr section does not receive primary inputs directly, there is no possibility of external switching activity affecting the VDDArr power grid and a single daughter stage may be sufficient.

In this example implementation, any observation point on the VDDArr power grid as well as on the VDDIO power grid may be used to supply the sense voltage to the voltage triggers. Observation points that are farther away from the power gates are chosen to sense the regions in the design that could be hit the worst by voltage drops. On the VDDIO power grid, voltage may be sensed at two different points to minimize any glitches that may happen during power up.

Figure 5:
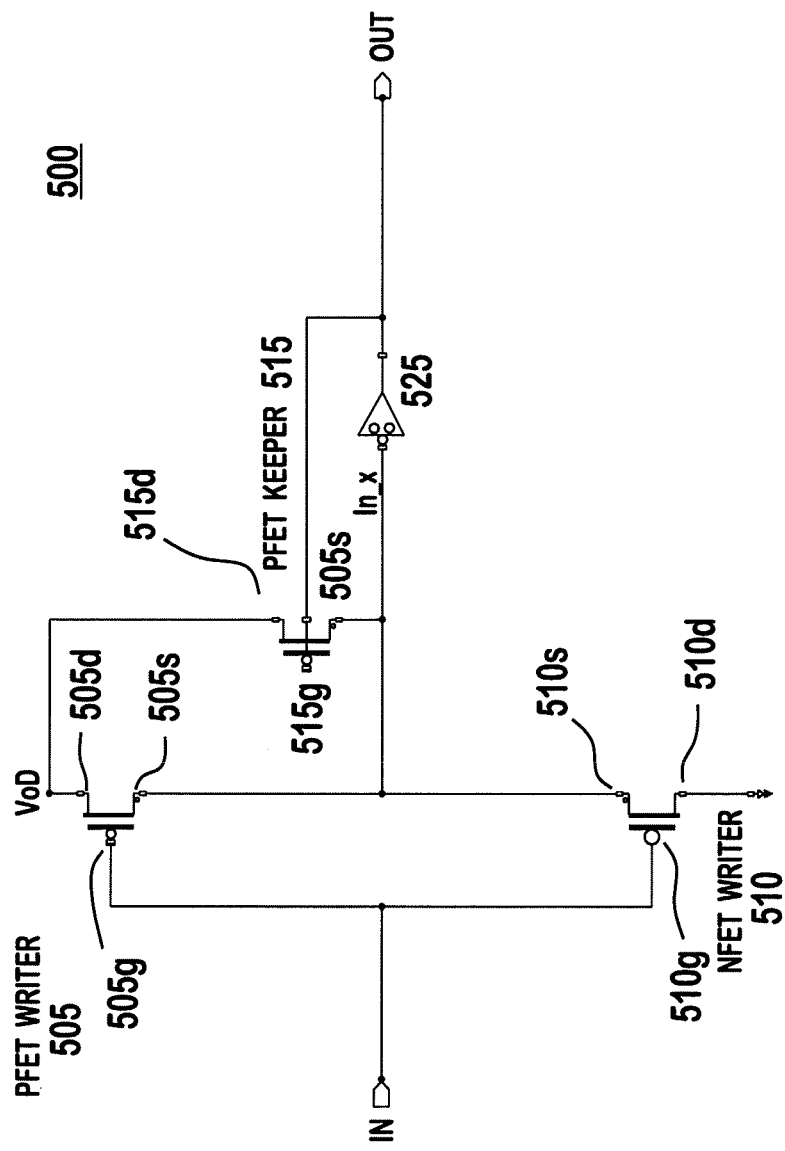
FIG. 5 is an example block diagram of a voltage threshold trigger.

FIG. 5 is an example block diagram of a voltage threshold trigger 500. In particular, a schematic representation of a Schmitt trigger is shown. Other voltage trigger implementations may be used. In this instance, the Schmitt trigger is a ratioed circuit and by varying the size of the writer to keeper, different trigger thresholds may be set. The trigger 500 shows a high threshold Schmitt trigger configuration. For example, the trigger point of this configuration is 90% of VDD when the input signal is going high and 10% of VDD when the input signal is going low. If the size of the keeper devices is reduced or the size of the writers is increased, a lower threshold Schmitt trigger circuit may be implemented.

Trigger 500 includes a PFET writer 505 that has a gate 505$g$ tied to an input, and a drain 505$d$ tied to VDD. It further includes a NFET writer 510 that has a gate 510$g$ tied to an input, and a drain 510$d$ tied to ground. A PFET keeper 515 has a drain 515$d$ tied to VDD and a gate 515$g$ tied to an output of an inverter 525. The source 505$s$ of PFET writer 505, source 510$s$ of NFET writer 510 and source 515$s$ of PFET keeper 515 are tied to an input of the inverter 525.

The node 'In_X' is subject to 'ratioed writes'. When input 'In' is at 0, 'Out' is at 0 and Node 'In_X' is at VDD. Note that when output is 0, the PFET keeper 515 also helps in holding the 'In_X' node to VDD since it is turned on.

In another case, when input 'In' starts going from 0 to 1 (i.e., rising to VDD), the PFET writer 505 turns off and the NFET writer 510 turns on when the input 'In' goes above the trip point of the inverter 525 formed by devices PFET writer 505 and NFET writer 510. But, the node 'In_X' will not go to 0 immediately. As the NFET writer 510 tries to pull node In_X to 0, the PFET keeper 515 tries to hold the node to VDD. The two devices act like a resistance divider network since both of them are on simultaneously. As long as the strength of the NFET writer 510 is greater than the PFET keeper 515, (i.e., the resistance of NFET writer 510 is smaller than that of the PFET keeper 515), the voltage on node 'In_X' will go below 50% VDD. As the voltage at 'In_X' crosses the trip point of the inverter 525, the output 'Out' starts going high. The more 'Out' goes high, the weaker the PFET keeper 515 becomes since it will only be weakly turned on. This assists the NFET writer 510 pulldown the 'In_X' node down even stronger. Finally, the NFET writer 510 pulls down the 'In_X' node to 0 and the PFET keeper 515 turns off totally as the 'Out' node goes high. The input voltage 'In' at which the output node 'Out' goes high may be controlled by controlling the relative sizes of PFET keeper 515 and the NFET writer 510. For example, the writer to keeper strength may be approximately 1.5:1.

Figure 6:
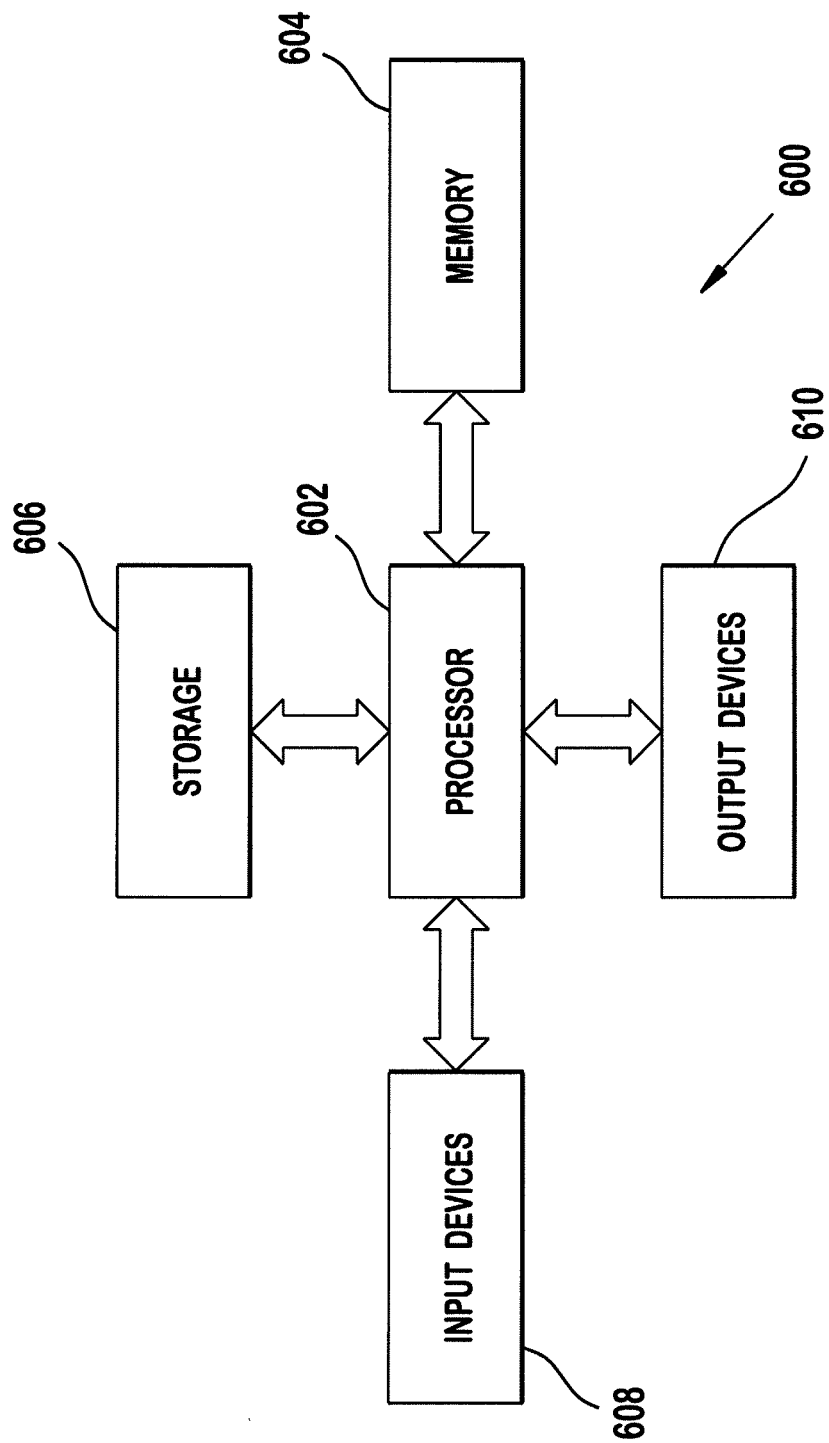
FIG. 6 is a block diagram of an example device in which one or more disclosed embodiments may be implemented.

FIG. 6 is a block diagram of an example device 600 in which one or more disclosed embodiments may be implemented. The device 600 may include, for example, a computer, a gaming device, a handheld device, a set-top box, a television, a mobile phone, or a tablet computer. The device 600 includes a processor 602, a memory 604, a storage 606, one or more input devices 608, and one or more output devices 610. It is understood that the device may include additional components not shown in FIG. 3.

The processor 602 may include a central processing unit (CPU), a graphics processing unit (GPU), a CPU and GPU located on the same die, one or more processor cores, wherein each processor core may be a CPU or a GPU. The memory 604 may be located on the same die as the processor 602, or may be located separately from the processor 604. The memory 604 may include a volatile or non-volatile memory, for example, random access memory (RAM), dynamic RAM, or a cache.

The storage 606 may include a fixed or removable storage, for example, hard disk drive, solid state drive, optical disk, or flash drive. The input devices 608 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 610 may include a display, a speaker, a printer, a haptic feedback device, one or more lights, an antenna, or a network connection (e.g., a wireless local area network card for transmission and/or reception of wireless IEEE 802 signals).

Figure 7:
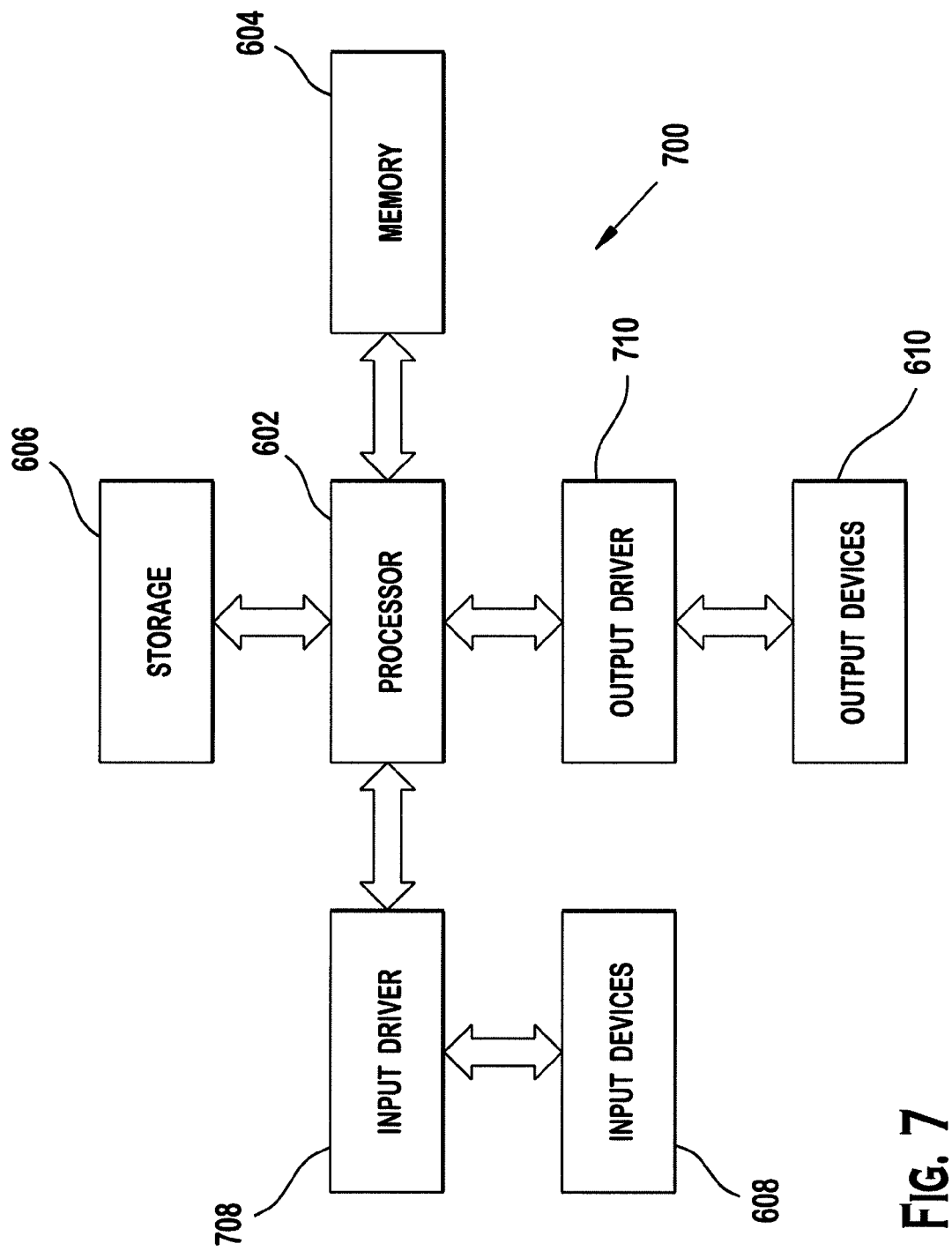
FIG. 7 is a block diagram of an alternate example device in which one or more disclosed embodiments may be implemented.

FIG. 7 is a block diagram of an alternate example device 700 in which one or more disclosed embodiments may be implemented. Elements of the device 700 which are the same as in the device 600 are given like reference numbers. In addition to the processor 602, the memory 604, the storage 606, the input devices 608, and the output devices 610, the device 700 also includes an input driver 708 and an output driver 710.

The input driver 708 communicates with the processor 602 and the input devices 608, and permits the processor 602 to receive input from the input devices 608. The output driver 710 communicates with the processor 602 and the output devices 610, and permits the processor 602 to send output to the output devices 610.

Embodiments of the present invention may be represented as instructions and data stored in a computer-readable storage medium. For example, aspects of the present invention may be implemented using Verilog, which is a hardware description language (HDL). When processed, Verilog data instructions may generate other intermediary data, (e.g., netlists, GDS data, or the like), that may be used to perform a manufacturing process implemented in a semiconductor fabrication facility. The manufacturing process may be adapted to manufacture semiconductor devices (e.g., processors) that embody various aspects of the present invention.

Although features and elements are described above in particular combinations, each feature or element may be used alone without the other features and elements or in various combinations with or without other features and elements. The methods provided may be implemented in a general purpose computer, a processor or any IC that utilizes power gating functionality. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

What is claimed is:

1. A power gate circuit, comprising:
   a sleep mode power gate controlled by a first combination of sleep and shutdown mode inputs;
   a shutdown mode multi-level power gate controlled by a second combination of the sleep and shutdown mode inputs, wherein the shutdown mode multi-level power gate includes at least two daughter power gates and a mother power gate, wherein a trigger corresponding to a daughter power gate triggers another daughter power gate and another trigger corresponding to the another daughter triggers the mother power gate; and
   a power gate control circuit connected to the sleep mode power gate and the shutdown mode multi-level power gate, wherein the power gate control circuit provides the first combination of sleep and shutdown mode inputs and the second combination of sleep and shutdown mode inputs.

2. The power gate circuit of claim 1, wherein the power gate control circuit provides a power okay output.

3. The power gate circuit of claim 1, wherein the sleep mode power gate is an n-type field effect transistor (NFET) and the shutdown mode multi-level power gate is a p-type FET (PFET).

4. The power gate circuit of claim 1, wherein the shutdown mode multi-level power gate is at least two p-type field effect transistors.

5. The power gate circuit of claim 1, wherein the trigger is a selectable voltage trigger.

6. The power gate circuit of claim 1, wherein the trigger and the another trigger further comprises:
   an inverter having an output;
   a n-type writer having a n-type writer gate connected to the input signal; and
   a p-type keeper having a p-type keeper gate connected to the output, wherein a p-type keeper source, an input of the inverter, and a n-type writer source are connected to an input node,
   wherein a ratio between the n-type writer and the p-type keeper controls what value of the input signal generates a high signal at the output.

7. The power gate circuit of claim 6, wherein the ratio depends on a size of the n-type writer and the p-type keeper.

8. The power gate circuit of claim 1, wherein the shutdown mode multi-level power gate minimizes inrush current during power up of an integrated circuit.

9. The power gate circuit of claim 1, wherein the sleep mode power gate counteracts leakage in an integrated circuit.

10. An electronic device comprising the power gate circuit of claim 1.

11. An integrated circuit, comprising:
    a power gate responsive to a sleep mode input from a power gate controller; and
    a multi-level power gate responsive to a shutdown mode input from the power gate controller, wherein the multi-level power gate includes p-type field effect transistor (PFET) daughter power gates and a PFET mother power gate, wherein a trigger corresponding to a PFET daughter power gate triggers another PFET daughter power gate and another trigger corresponding to the another PFET daughter power gate triggers the PFET mother power gate.

12. The integrated circuit of claim 11, wherein the power gate controller provides a power okay output on a condition that an array power grid and an input/output power grid has reached a predefined threshold of a voltage power supply.

13. The integrated circuit of claim 11, wherein the power gate is a n-type field effect transistor (NFET) and the multi-level power gate is a p-type FET (PFET).

14. The integrated circuit of claim 11, wherein the trigger and the another trigger further comprises:
    an inverter having an output;
    a n-type transistor writer having a gate connected to the input signal; and
    a p-type transistor keeper having a gate connected to the output, wherein each source of the p-type transistor keeper and n-type transistor writer, and an input of the inverter are connected to an input node,
    wherein a ratio between the n-type transistor writer and the p-type transistor keeper controls what value of the input signal generates a high signal at the output.

15. The power gate control circuit of claim 14, wherein the ratio depends on a size of the n-type transistor writer and the p-type transistor keeper.

16. A method for power gate control, comprising:
    providing one of a sleep mode activation input and a shutdown mode activation input from a power gate controller;
    controlling a state of a power gate responsive to a sleep mode activation input;
    controlling a state of a multi-level power gate responsive to a shutdown activation mode input, wherein the multi-level power gate includes at least a daughter power gate and a mother power gate;
    triggering a daughter power gate on a condition that an input/output power grid has reached a predefined voltage threshold for another daughter power gate;
    triggering the mother power gate on a condition that the input/output power grid has reached a different predefined voltage threshold for the daughter power gate; and
    powering up at least one of an array power grid and the input/output power grid in response to one of the sleep mode activation input and the shutdown mode activation input.

17. The method of claim 16, further comprising:
    generating a power okay output on a condition that an array power grid and the input/output power grid has reached a predefined percentage of a voltage power supply.

18. A non-transitory computer-readable storage medium configured to store a set of instructions used for manufacturing an electronic device, wherein the electronic device comprises:
    a sleep mode power gate configured to be controlled by a first combination of sleep and shutdown mode inputs;
    a shutdown mode multi-level power gate configured to be controlled by a second combination of the sleep and shutdown mode inputs, wherein the shutdown mode multi-level power gate includes at least two daughter power gates and a mother power gate, wherein a trigger corresponding to a daughter power gate triggers another daughter power gate and another trigger corresponding to the another daughter triggers the mother power gate; and a power gate control circuit configured to be connected to the sleep mode power gate and the shutdown mode multi-level power gate, the power gate control circuit configured to provide the first combination of sleep and shutdown mode inputs and the second combination of sleep and shutdown mode inputs.

19. The non-transitory computer-readable storage medium of claim 18, wherein the instructions are Verilog data instructions.

20. The non-transitory computer-readable storage medium of claim 18, wherein the instructions are hardware description language (HDL) instructions.

* * * * *